United States Patent
Jha et al.

(10) Patent No.: US 10,541,190 B2
(45) Date of Patent: Jan. 21, 2020

(54) STACKED DIE PACKAGE WITH THROUGH-MOLD THERMALLY CONDUCTIVE STRUCTURES BETWEEN A BOTTOM DIE AND A THERMALLY CONDUCTIVE MATERIAL

(71) Applicant: Intel Corporation, Santa Clara, CA (US)

(72) Inventors: Chandra Jha, Chandler, AZ (US); Eric Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/769,705

(22) PCT Filed: Nov. 30, 2015

(86) PCT No.: PCT/US2015/063046
§ 371 (c)(1),
(2) Date: Apr. 19, 2018

(87) PCT Pub. No.: WO2017/095385
PCT Pub. Date: Jun. 8, 2017

(65) Prior Publication Data
US 2018/0308784 A1    Oct. 25, 2018

(51) Int. Cl.
*H01L 23/433* (2006.01)
*H01L 23/24* (2006.01)
(Continued)

(52) U.S. Cl.
CPC ............ *H01L 23/433* (2013.01); *H01L 23/24* (2013.01); *H01L 23/3128* (2013.01); *H01L 23/3677* (2013.01); *H01L 23/3737* (2013.01)

(58) Field of Classification Search
CPC . H01L 2225/06555; H01L 2225/06568; H01L 25/0657; H01L 25/074;
(Continued)

(56) References Cited

U.S. PATENT DOCUMENTS 6,849,940 B1 * 2/2005 Chan .................. H01L 23/16
257/675
2002/0140108 A1   10/2002 Johnson
(Continued)

OTHER PUBLICATIONS

International Preliminary Report on Patentability for International Patent Application No. PCT/US2015/063046, dated Jun. 14, 2018, 12 pages.
(Continued)

*Primary Examiner* — Scott B Geyer
(74) *Attorney, Agent, or Firm* — Schwabe, Williamson & Wyatt P.C.

(57) ABSTRACT

An apparatus is described that includes a first semiconductor die. A second semiconductor die is stacked on the first semiconductor die. The first semiconductor die has a larger surface area than the second semiconductor die such that there exists a peripheral region of the first semiconductor die that is not covered by the second semiconductor die. The apparatus includes thermally conductive material above the second semiconductor die. The apparatus includes a compound mold between the thermally conductive material and both the second semiconductor die and the peripheral region of the first semiconductor die. The apparatus includes a thermally conductive structure extending through the compound mold that thermally couples the peripheral region to the thermally conductive material.

15 Claims, 13 Drawing Sheets

(51) Int. Cl.
*H01L 23/31* (2006.01)
*H01L 23/367* (2006.01)
*H01L 23/373* (2006.01)

(58) Field of Classification Search
CPC ............. H01L 23/3121; H01L 23/3128; H01L 2225/06589; H01L 23/367–3677
See application file for complete search history.

(56) References Cited

U.S. PATENT DOCUMENTS

| | | |
|---|---|---|
| 2008/0061447 A1 | 3/2008 | Matayabas, Jr. et al. |
| 2008/0211110 A1* | 9/2008 | Otsuka ................ H01L 23/3128 257/777 |
| 2008/0277777 A1 | 11/2008 | Liao et al. |
| 2009/0127700 A1 | 5/2009 | Romig |
| 2009/0224400 A1* | 9/2009 | Rahman .............. H01L 25/0652 257/713 |
| 2015/0069635 A1 | 3/2015 | Kim et al. |

OTHER PUBLICATIONS

International Search Report and Written Opinion for International Patent Application No. PCT/US2015/063046 dated Aug. 18, 2016, 15 pgs.

* cited by examiner

STACKED DIE PACKAGE WITH THROUGH-MOLD THERMALLY CONDUCTIVE STRUCTURES BETWEEN A BOTTOM DIE AND A THERMALLY CONDUCTIVE MATERIAL

CROSS-REFERENCE TO RELATED APPLICATION

This patent application is a U.S. National Phase Application under 35 U.S.C. § 371 of International Application No. PCT/US2015/063046, filed Nov. 30, 2015, entitled "STACKED DIE PACKAGE WITH THROUGH-MOLD THERMALLY CONDUCTIVE STRUCTURES BETWEEN A BOTTOM DIE AND A THERMALLY CONDUCTIVE MATERIAL," which designates the United States of America, the entire disclosure of which is hereby incorporated by reference in its entirety and for all purposes.

FIELD OF INVENTION

The field of invention pertains generally to the semiconductor arts, and, more specifically, to a stacked die package with through-mold thermally conductive structures between a bottom die and a thermally conductive material.

BACKGROUND

The semiconductor arts has traditionally faced the challenge of attempting to integrate electronic functionality into as small a volume as possible. Chip stacking has recently emerged as a popular packaging technology for integrating multiple semiconductor die into a same semiconductor package. A problem, however, is the heat dissipation that multiple die can generate within the package.

FIGURES

A better understanding of the present invention can be obtained from the following detailed description in conjunction with the following drawings, in which.

DETAILED DESCRIPTION

Figure 1:
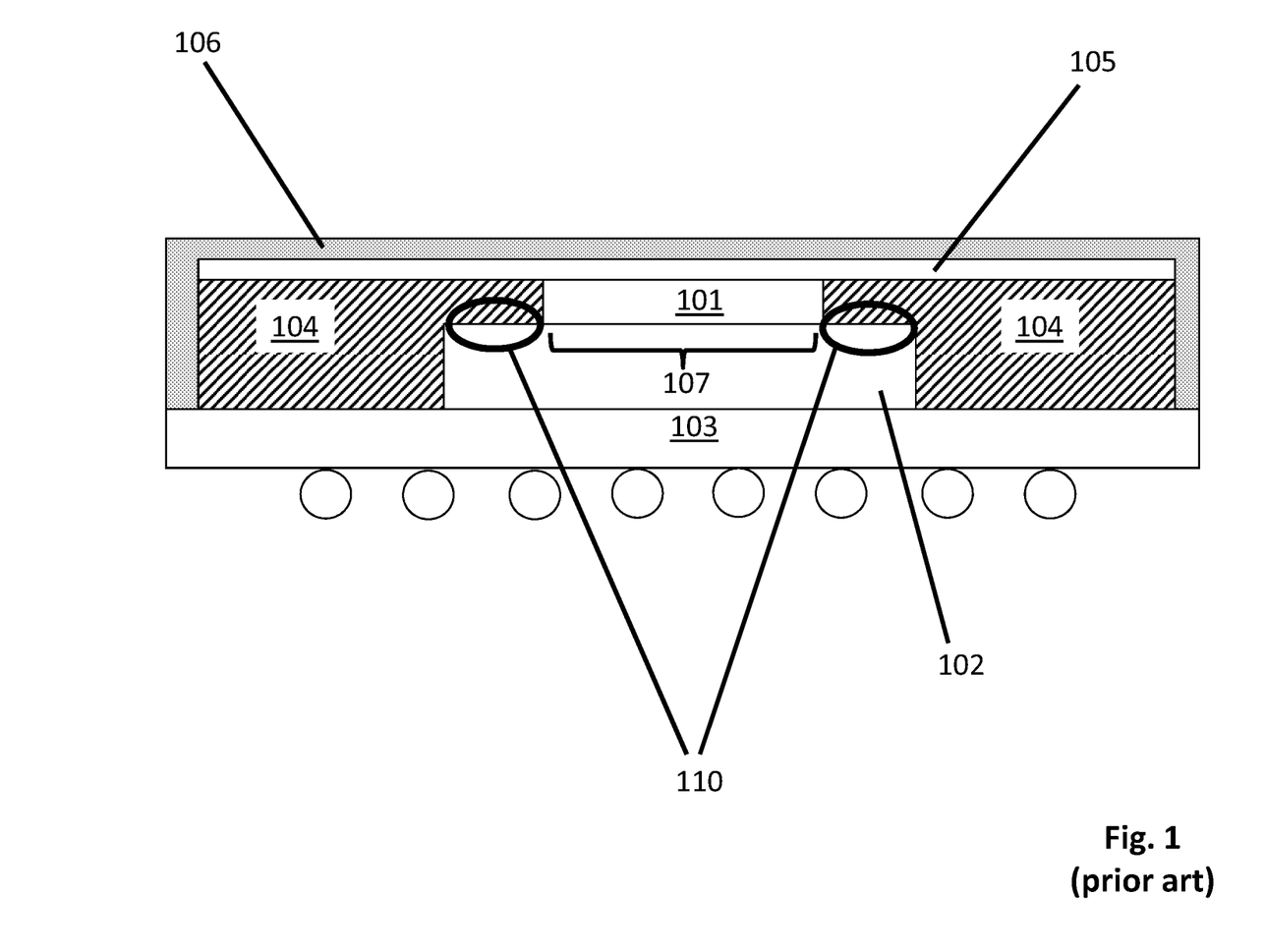
FIG. 1 shows a prior art stacked die package.

FIG. 1 shows a standard stacked die structure that includes a top semiconductor die 101 stacked on top of a bottom semiconductor die 102. The top die 101 may be electrically and mechanically attached to the bottom die 102 through, e.g., a land grid array structure or micro-bumps. Likewise, the bottom die 102 is electrically and mechanically coupled to a substrate 103 with, e.g., a land grid array or micro-bumps. A ball grid array may exist on the bottom of the package substrate 103 which forms the I/Os of the package.

Surrounding the stacked die structure is a mold compound 104 that is covered by a thermally conductive interface material 105. The resulting structure is encapsulated with a lid 106 that may also act as a heat spreader. The thermally conductive interface material 105 is a layer of thermally conductive material (e.g., silicone polymer resin filled with a thermally conductive filler, a polymer based thermal grease, etc.) and is used to propagate heat generated from the stacked die 101, 102 to the lower surface area of the package lid 106. The lid 106, by spreading the heat generated from the stacked die structure uniformly across its surface, can remove heat from the stacked die 101, 102 more efficiently.

As observed in FIG. 1, the thermally conductive interface material 105 is positioned in close proximity to the top surface of the upper die 101. Additionally, the thermal conductance between the top die 101 and the thermally conductive interface material 105 may be reduced, e.g., with a thermally conductive adhesive between the top die 101 and thermally conductive interface material 105 and/or thermally conductive lands/balls/studs formed on the upper surface of the top die 101 that are in contact with the thermally conductive interface material 105.

Higher thermal conductance may also exist between the portion 107 of the bottom die 102 that resides directly beneath the top die 101. As with the interface between the top die 101 and thermally conductive interface material 105, the interface between the top die 101 and portion 107 of the bottom die may be designed to exhibit high thermal conductivity with, e.g., a thermally conductive adhesive and/or lands/balls/studs that are mechanically coupled between the two die 101, 102.

A problem, however, concerns the regions 110 of the upper surface of the bottom die 102 that are not directly beneath the top die 101. The thermal conductance between these regions 110 and thermally conductive interface material 105 is determined primarily by the thermal conductance of the mold compound 104 that resides between these regions 110 and thermally conductive interface material 105.

Traditional mold compounds, such as silica filler molds, commonly have a thermal conductivity of less than 2.0 W/mK (e.g., approximately 1.0 W/mk) because the silica or other traditional mold compound filler is thermally insulating. Unfortunately, traditional compound molds having thermally insulating fillers do not possess a thermal conductivity that is high enough to properly remove heat from regions 110, particularly if the bottom die 102 exhibits a "hot spot" at regions 110. A hot spot is, e.g., a surface area of a semiconductor die that generates substantially more heat than other surface regions of the die (e.g., because the die includes high voltage, high current and/or high frequency transistors directly beneath the hot spot).

Non traditional mold compounds having higher thermal conductivities because they include fillers that are substantially thermally conductive exist (e.g., alumina filler molds, copper filler molds, etc., that exhibit thermal conductivities of approximately 4.0 W/mk of higher). However, these compounds unfortunately are more expensive than the traditional mold compounds and they exhibit a higher thermal coefficient of expansion. Besides the higher expense being undesirable, the higher thermal coefficient of expansion can cause reliability problems because stresses are induced within the package while the compound is conducting heat.

Figure 2:
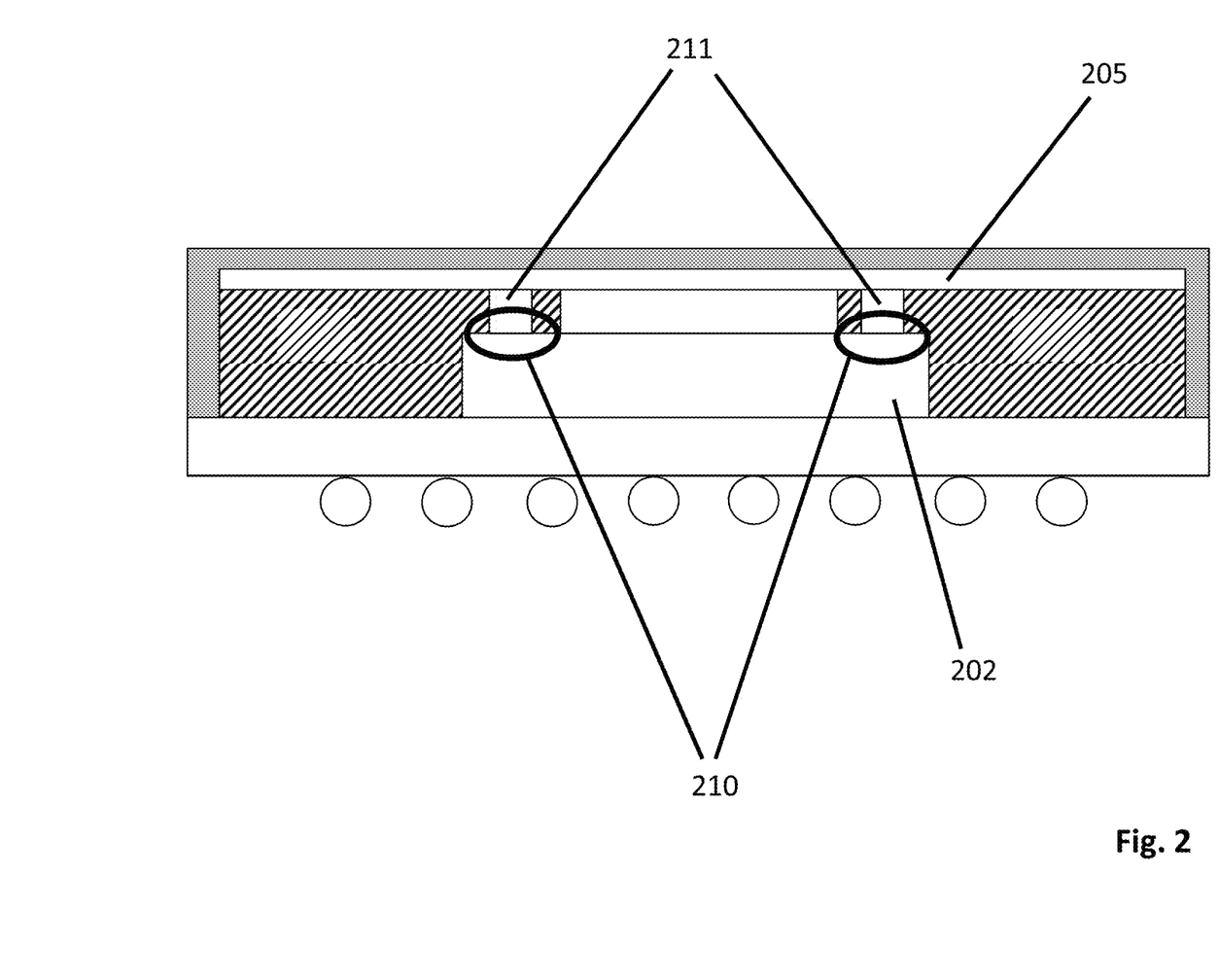
FIG. 2 shows an improved prior art package.

FIG. 2 shows an improved stacked die structure having thermally conductive structures 211 that are deliberately placed between the outer regions 210 of the upper surface of the bottom die 202 and the thermally conductive interface material 205. The thermally conductive structures 211 are designed to thermally couple regions 210 to the thermally conductive interface material 205 in order to dramatically reduce the thermal resistance that exists between corresponding regions 110 and the thermally conductive interface material 105 of FIG. 1.

In various embodiments, the thermally conductive structures 211 are strategically placed directly over a known hot spot of the bottom die 202. Here, designers of the bottom die 202 will be able to understand from their design which regions of the die surface will generate heat commensurate with a hot spot (e.g., by knowing which transistors operate with higher voltage, higher current and/or higher frequency).

With an understanding of where such hot spots will appear at outer regions 210, the designers of the package can strategically "drop-in" one or more thermally conductive structures 211 directly over each such hot spot. Alternatively or in combination, thermally conductive structures may be randomly and/or periodically located at various locations around the circumference of the upper surface bottom die 202 along regions 210 to more generally remove heat from the surface of the bottom die around regions 210.

FIGS. 3a through 3i show a method for manufacturing a stacked package. As observed in FIG. 3a, in an embodiment a semiconductor wafer 322 containing multiple instances of the bottom die 302_1, 302_2, etc. is mounted to a carrier wafer 313 (e.g., with a removable adhesive). In an alternative process, rather than attached an entire wafer of bottom die to the carrier wafer 313, instead, singulated bottom die are individually placed and affixed to the carrier wafer. For simplicity, the remainder of the discussion will refer to a process in which an entire wafer of bottom die is attached to the carrier wafer 313.

Figure 3A:
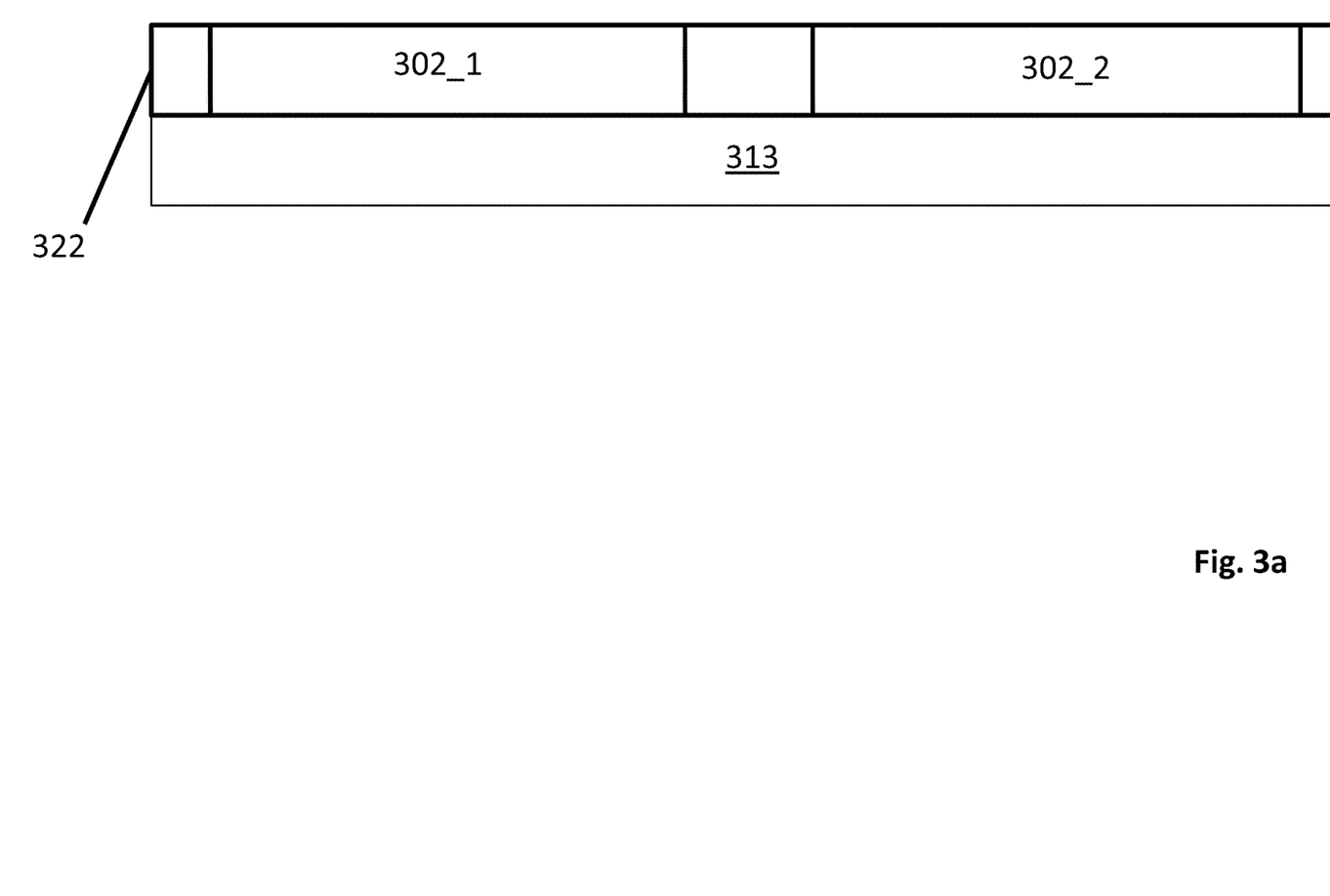
FIGS. 3a through 3i show a process flow for manufacturing a stacked die package.
Figure 3B:
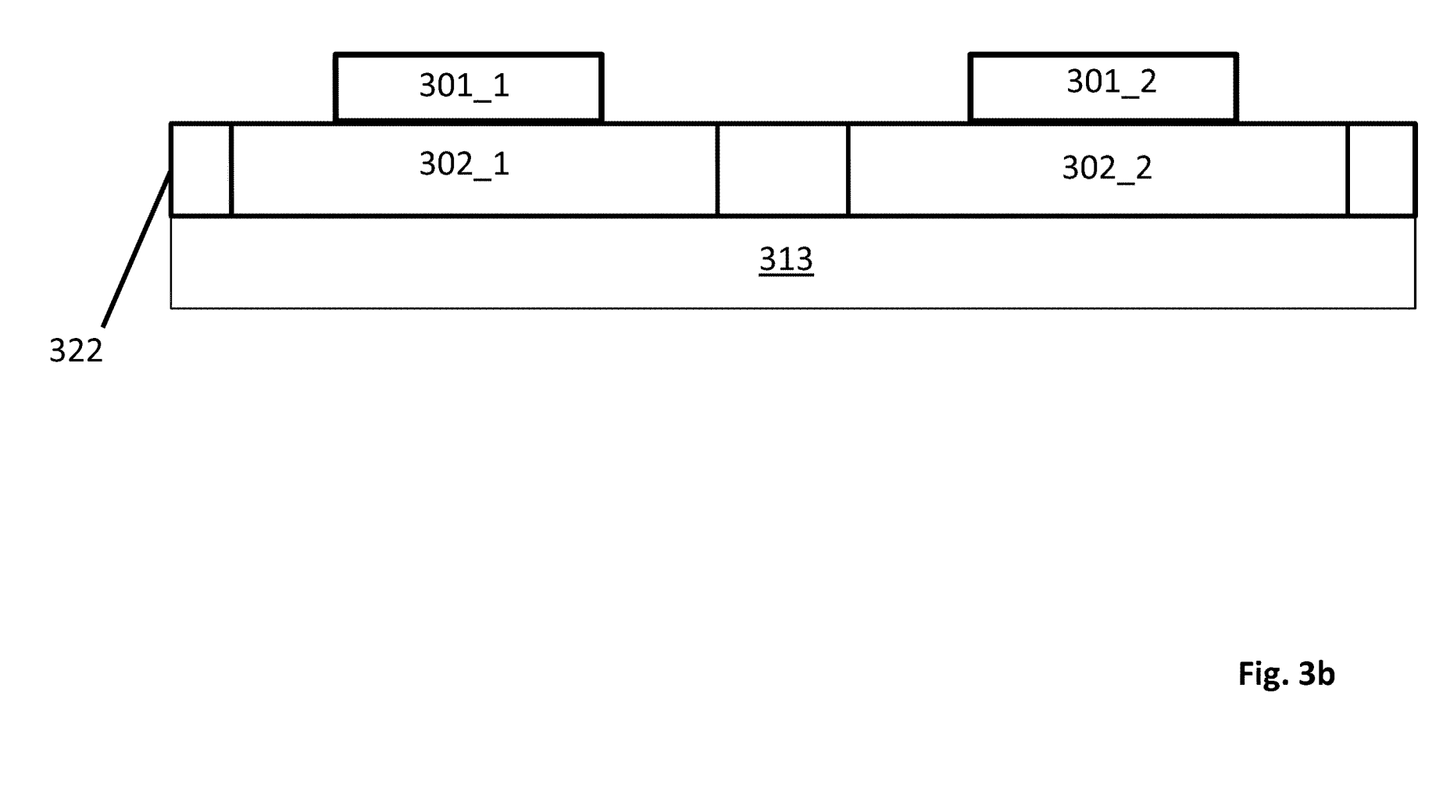

As observed in FIG. 3b, a respective top die 301_1, 301_2, etc. is properly positioned and affixed to a corresponding respective one of the bottom die 302_1, 302_2. In an embodiment, micro-bumps are used to electrically and mechanically couple the top die 301_1, 301_2 to their respective bottom die 302_1, 302_2.

In the case of micro-bump coupling, micro-bumps of solder are affixed to the surfaces of one of the top and bottom die 301, 302. Receiving lands on the other die are aligned with the bumps. When the two die are mated, the solder bumps are coupled to their respective lands and reflowed to form multiple micro-bump joints. For simplicity FIG. 3b does not show any micro-bumps and instead suggests a land-grid array interface between the bottom and top die 301, 302. Either type of joint may be used to provide electrical and/or thermally conductive coupling between the top and bottom die 301, 302.

Figure 3C:
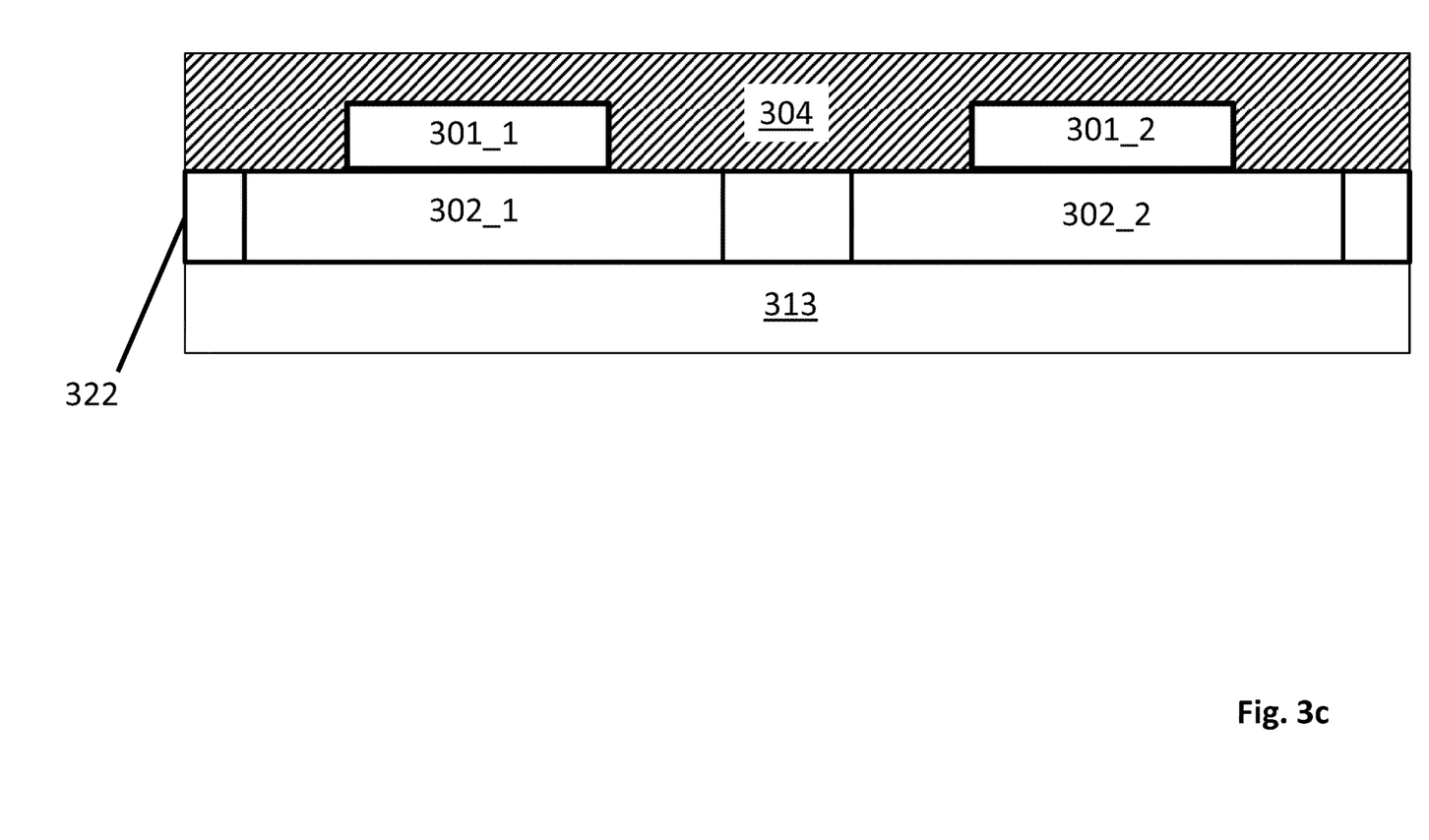

As observed in FIG. 3c, after the top die 301 are affixed to the bottom die 302 a conventional mold compound 304 as described above is formed over the stacked die array.

Figure 3D:
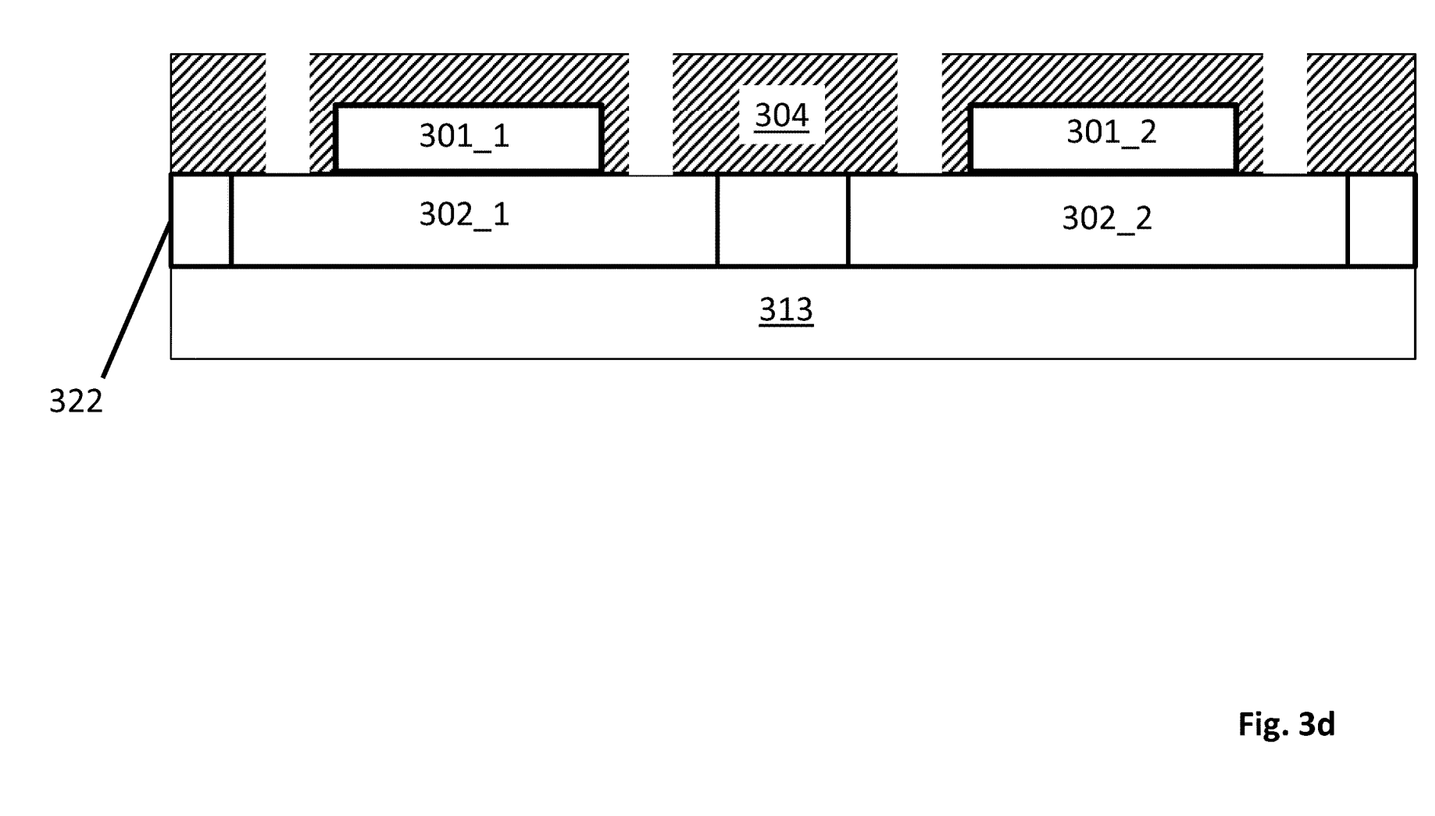

As observed in FIG. 3d, the mold 304 is etched, e.g., in strategic locations over expected hot spots of the lower die 302_1, 302_2 that extend beyond (i.e., are not respectively covered by) the surface area of the top die 301_1, 301_2. The etching may be performed with, e.g., laser ablation. With laser ablation, laser light is directed upon the mold 304 just above a hot spot region of the bottom die and mold compound material is steadily removed until the upper surface of the bottom die 302_1, 302_2 is reached.

Figure 3E:
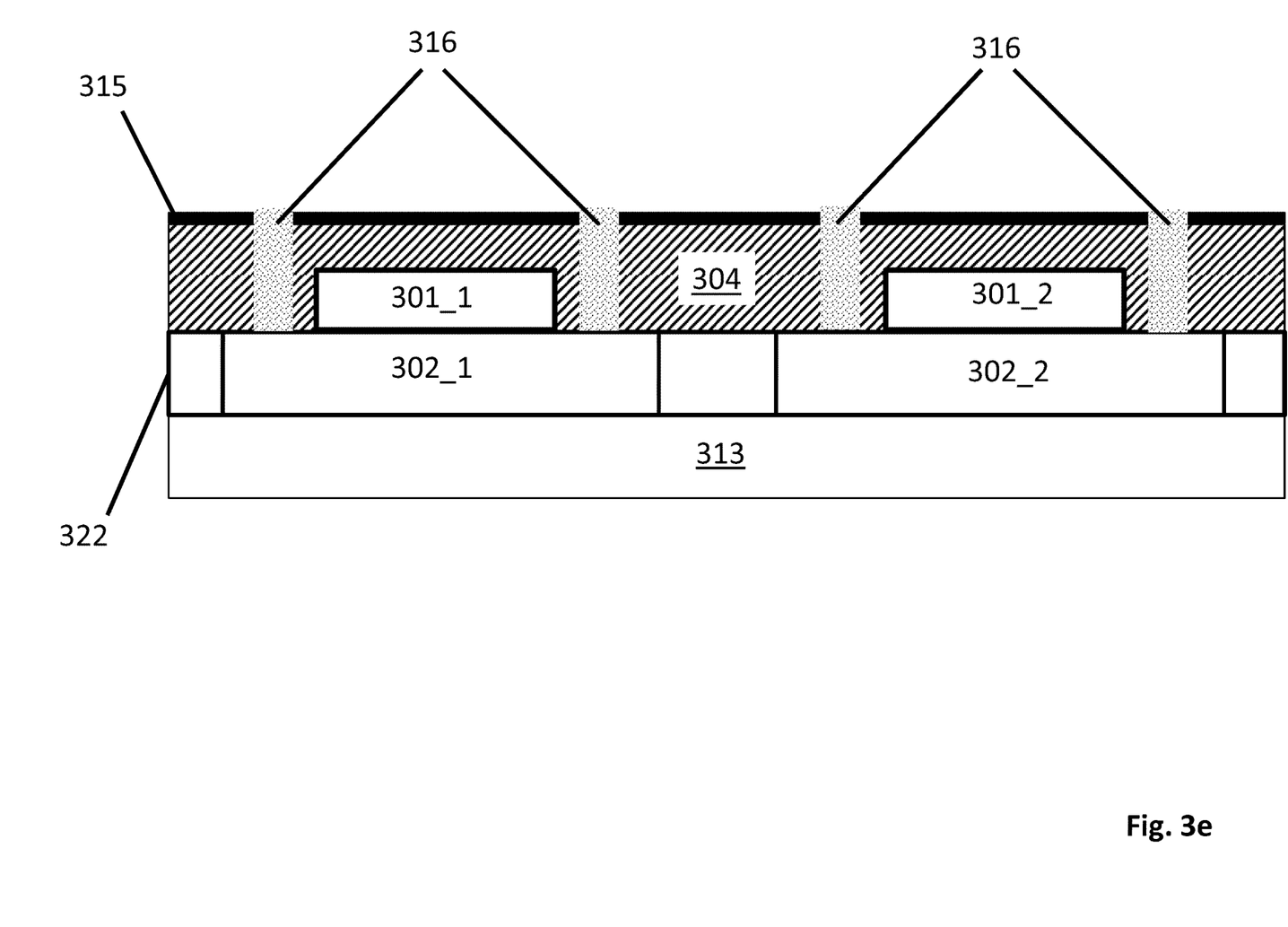

As observed in FIG. 3e, a stencil 315 is then placed on the surface of the mold 304 and thermally conductive paste 316 (e.g., solder paste is one possible paste) is pressed through openings in the stencil 315 that are aligned with the openings that were just formed in the mold 304. After the applied solder paste 316 suitably fills the openings in the mold 304, the paste 316 is sintered (hardened) through application of an elevated temperature. Alternative thermally conductive materials and/or fill techniques may be used to fill the mold openings. For example, copper or other metal or metal alloy may be plated into the openings.

Figure 3F:
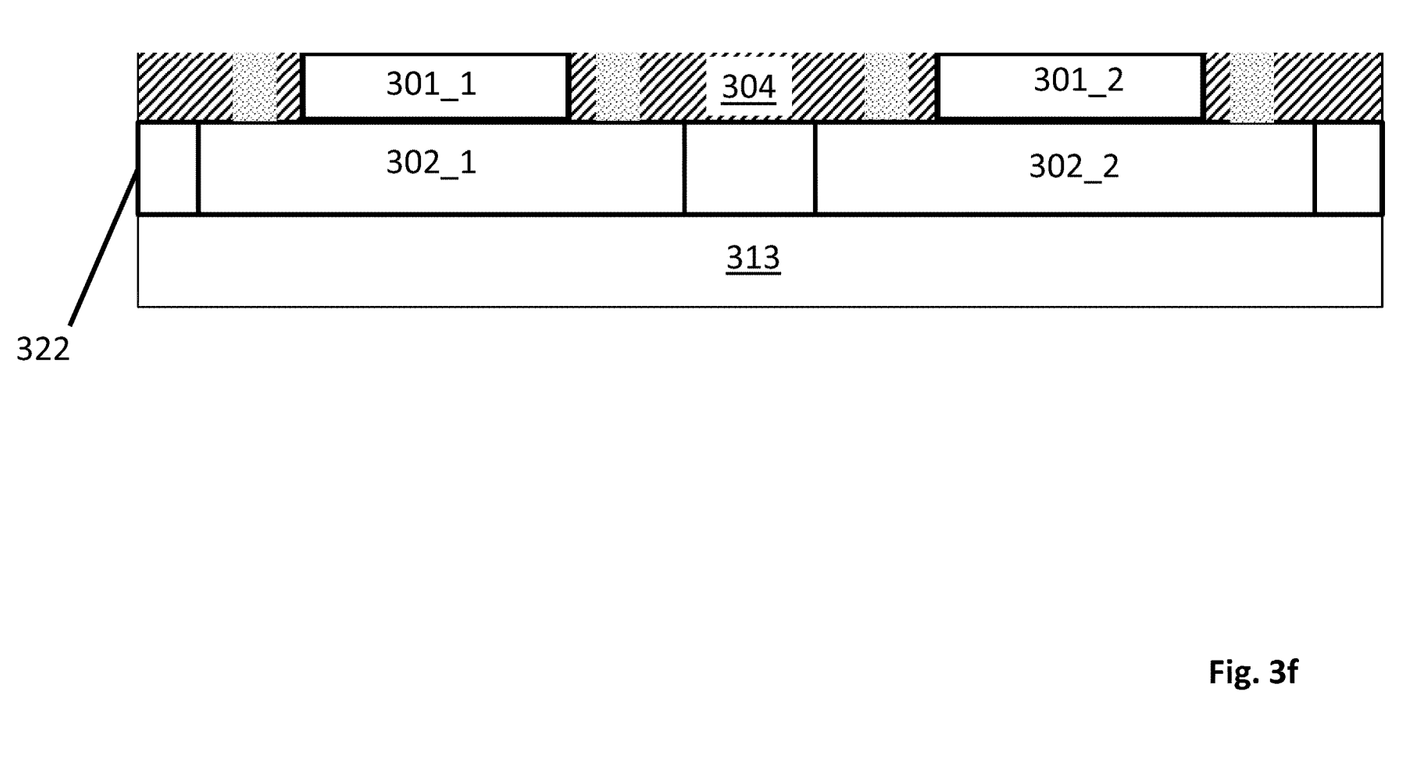

As observed in FIG. 3f, after the mold openings are filled with thermally conductive material 316, the resulting structure is thinned approximately to the top surface of the top die 301_1, 301_2. Here, various polishing or other planarization techniques may be used to form a substantially planar top surface 317 that extends approximately as high as the top surface of the top die 301_1, 301_2.

Figure 3G:
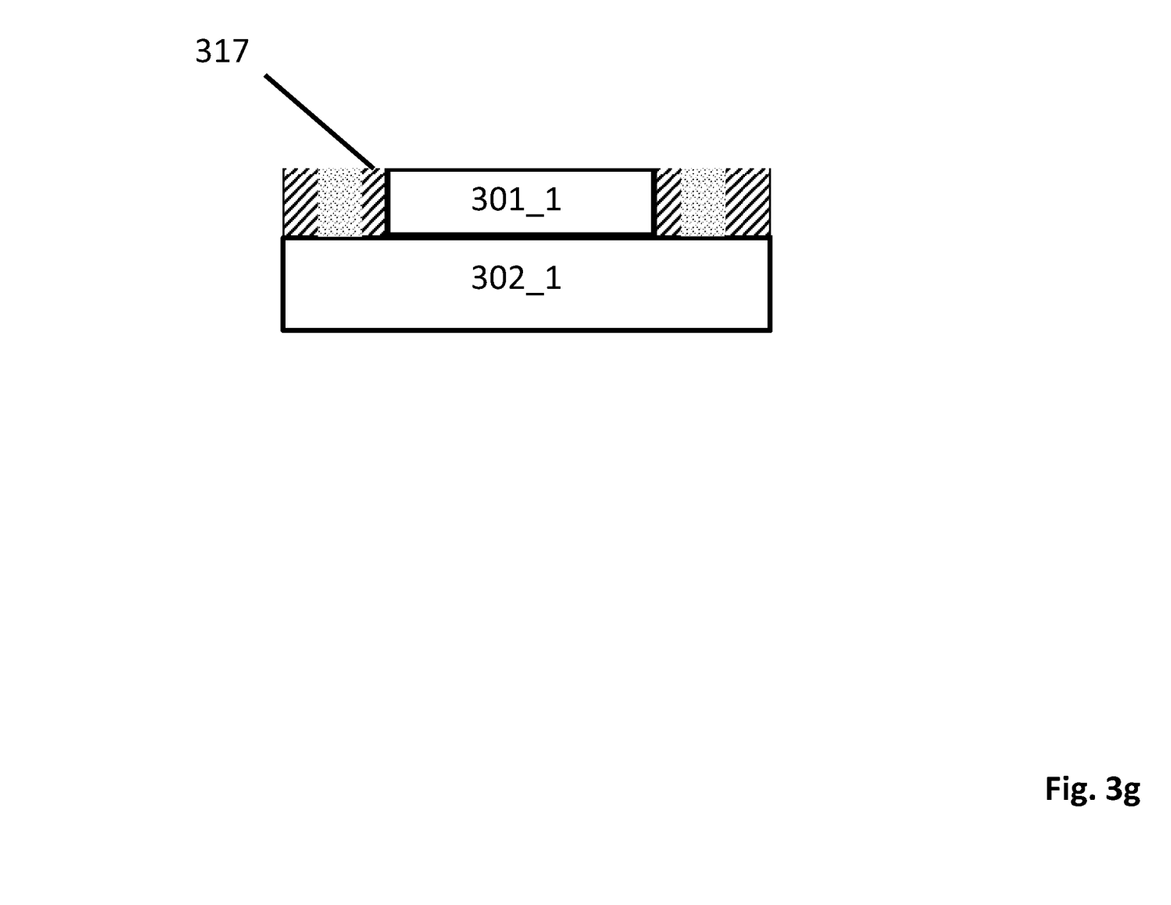

As observed in FIG. 3g, the carrier wafer 313 is removed and the bottom die wafer 322 is scribed and broken or sawed to singulate the array of stacked die structures that existed as of the end of the processing of FIG. 3f.

Figure 3H:
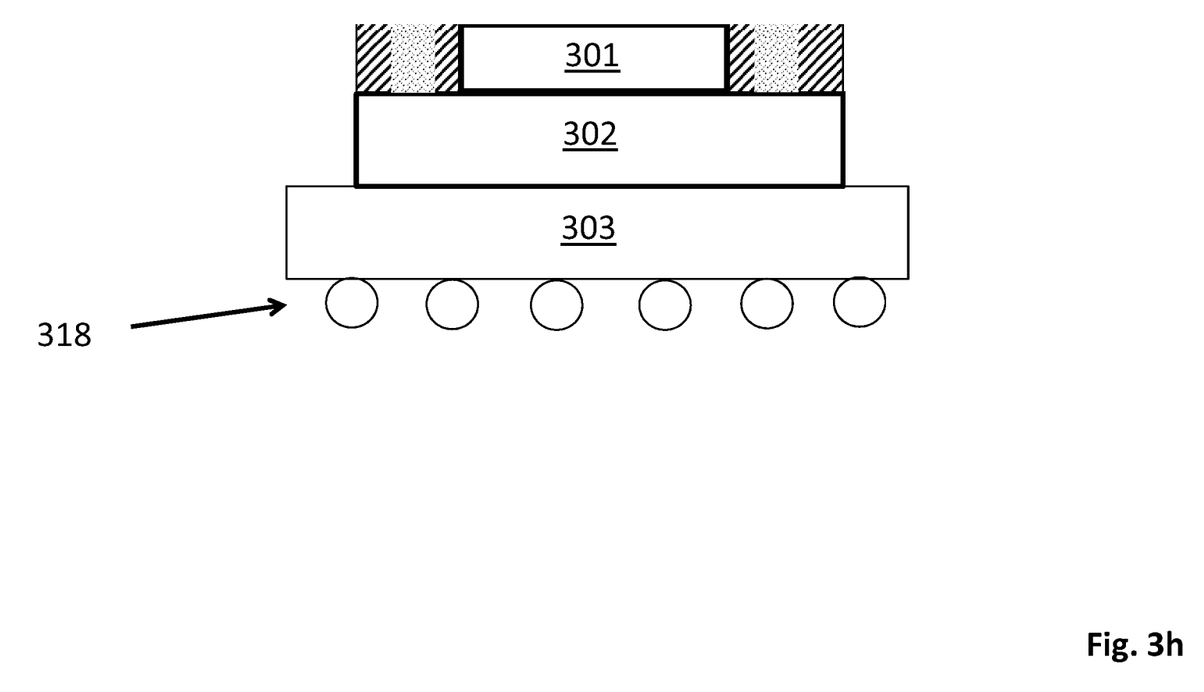

As observed in FIG. 3h, a singulated stacked die structure is mechanically and electrically attached to a package substrate 303. Here, the bottom surface of the bottom die 302 is electrically and mechanically coupled to the package substrate 303 through a land grid interface, micro-bump interface and/or via/stud interface. The electrical connections formed between the bottom of the bottom die 302 and the package substrate 303 correspond to the I/Os of the stacked structure. As such, electrical traces within the package substrate 303 run to, e.g., conductive balls 318 of a ball-grid array package interface.

Figure 3I:
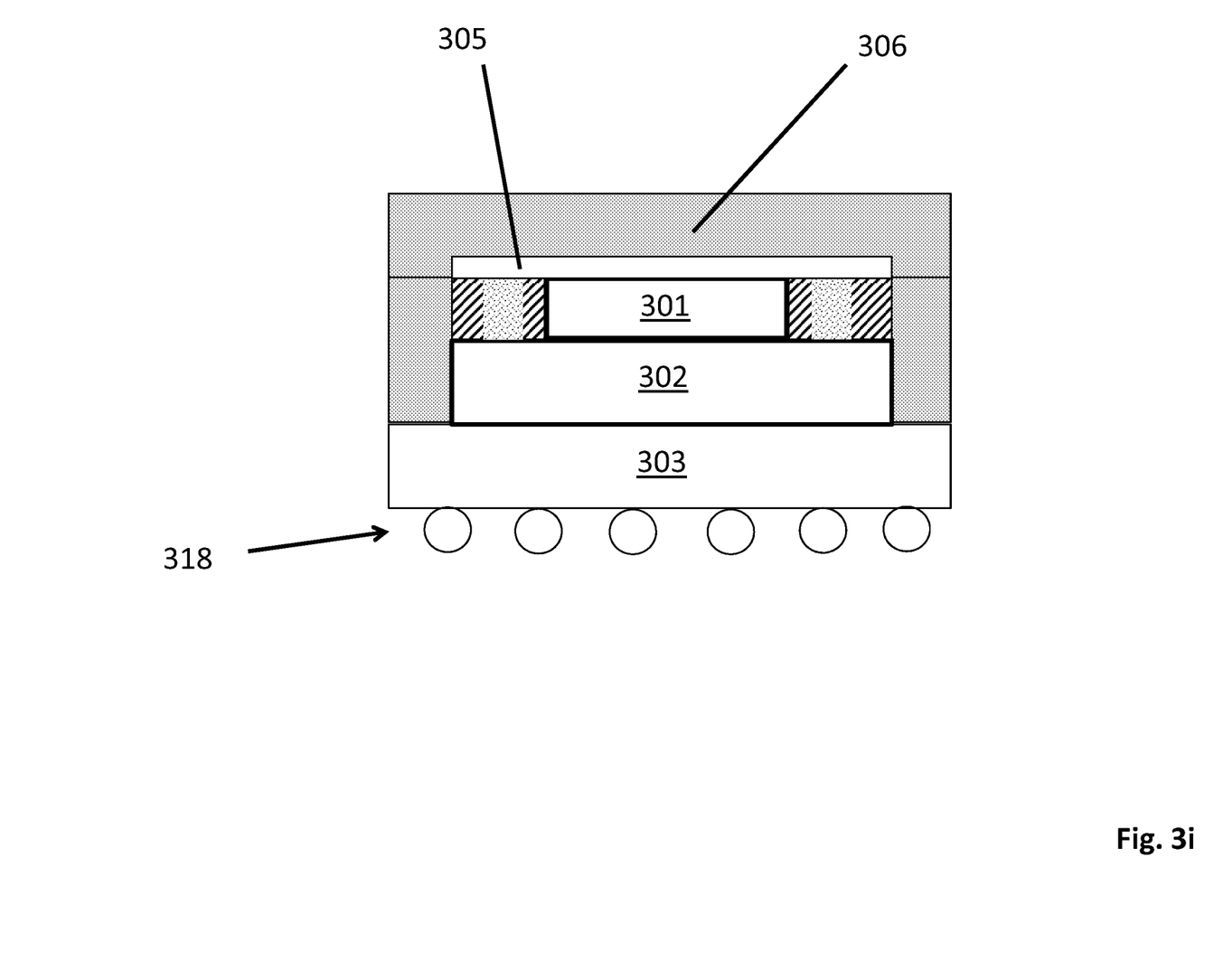

As observed in FIG. 3i, the thermally conductive interface material 305 is affixed to the top surface of the top die 301 and a lid 306 is placed over the thermally conductive interface material 305 and mounted to the package substrate 303 to encapsulate the stacked die structure. In alternative embodiments, the thermally conductive interface material 305 may be placed on the structure of FIG. 3f prior to singulation. The thermal conductance between the top die 301 and the thermally conductive interface material 305 may be reduced, e.g., with a thermally conductive adhesive between the top die 301 and the thermally conductive interface material 305 and/or thermally conductive lands/studs formed on the top of the top die 301 that are in contact with the thermally conductive interface material 305.

Figure 4:
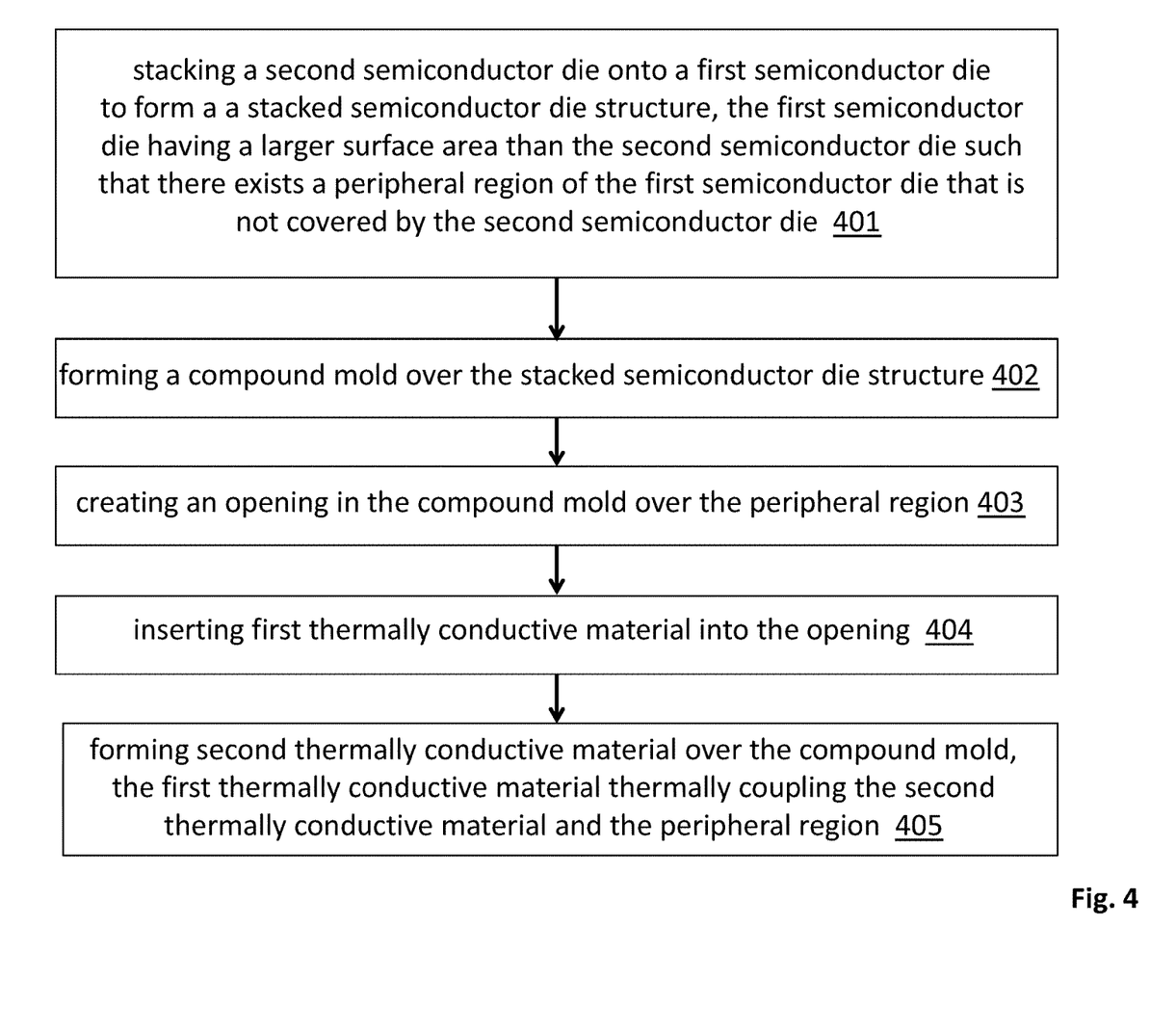
FIG. 4 shows a methodology of the process flow of FIGS. 3a through 3i.

FIG. 4 shows a method outlined by the process flow described just above. As observed in FIG. 4 the method includes stacking 401 a second semiconductor die onto a first semiconductor die to form a stacked semiconductor die structure, where, the first semiconductor die has a larger surface area than the second semiconductor die such that there exists a peripheral region of the first semiconductor die that is not covered by the second semiconductor die. The method also includes forming 402 a compound mold over the stacked semiconductor die structure. The method also includes creating 403 an opening in the compound mold over the peripheral region. The method includes inserting 404 first thermally conductive material into the opening. The method includes forming 405 a second thermally conductive material over the compound mold, the first thermally conductive material thermally coupling the second thermally conductive material and the peripheral region.

Figure 5:
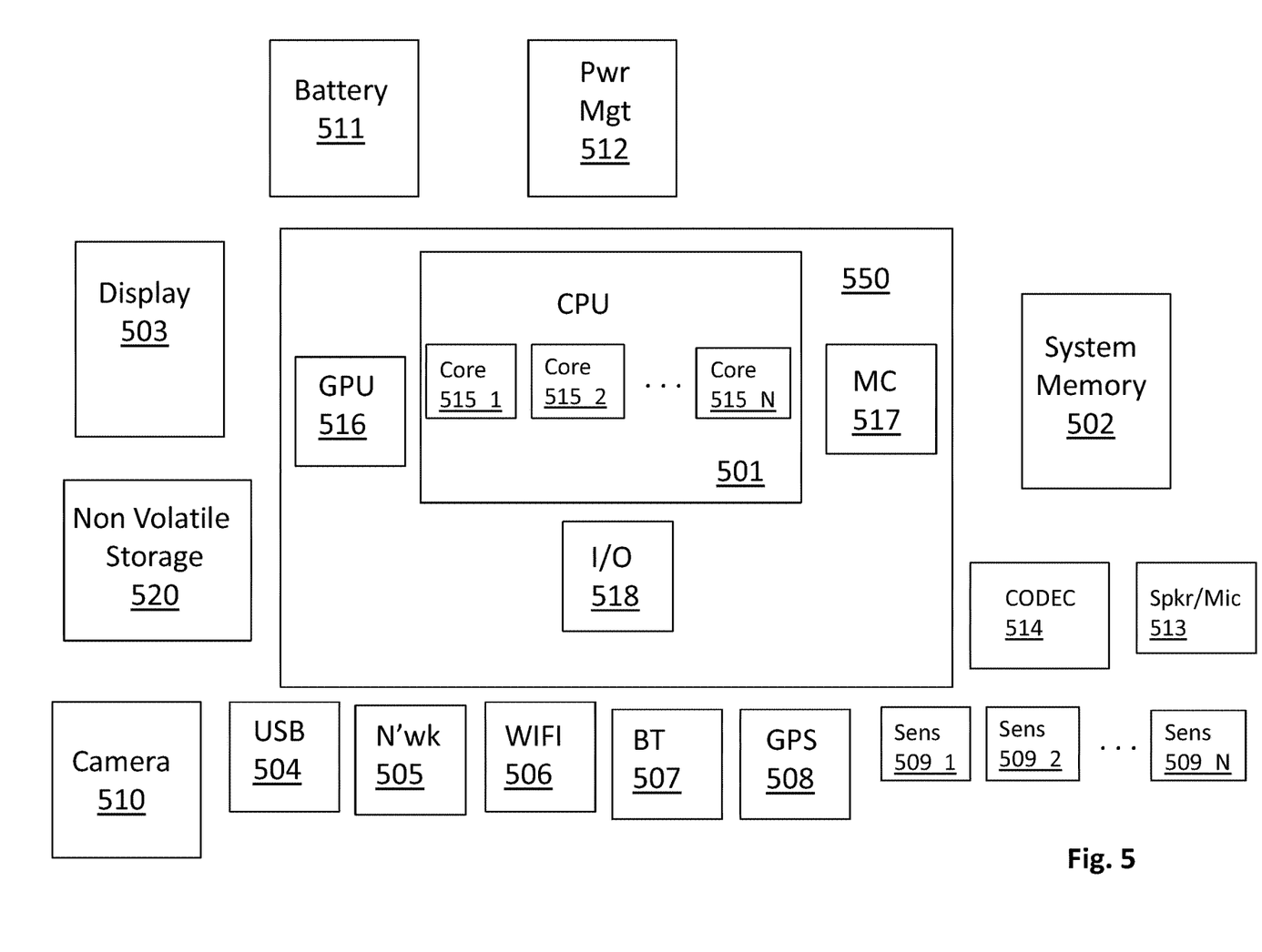
FIG. 5 shows a computing system.

FIG. 5 shows a depiction of an exemplary computing system 500 such as a personal computing system (e.g., desktop or laptop) or a mobile or handheld computing system such as a tablet device or smartphone, or, a larger computing system such as a server computing system.

As observed in FIG. 5, the basic computing system may include a central processing unit 501 (which may include, e.g., a plurality of general purpose processing cores and a main memory controller disposed on an applications processor or multi-core processor), system memory 502, a display 503 (e.g., touchscreen, flat-panel), a local wired point-to-point link (e.g., USB) interface 04, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System interface 508, various sensors 509_1 through 509_N (e.g., one or more of a gyroscope, an accelerometer, a magnetometer, a temperature sensor, a pressure sensor, a humidity sensor, etc.), a camera 510, a battery 511, a power management control unit 512, a speaker and microphone 513 and an audio coder/decoder 514.

An applications processor or multi-core processor 550 may include one or more general purpose processing cores 515 within its CPU 501, one or more graphical processing units 516, a memory management function 517 (e.g., a memory controller) and an I/O control function 518. The general purpose processing cores 515 typically execute the operating system and application software of the computing system. The graphics processing units 516 typically execute graphics intensive functions to, e.g., generate graphics information that is presented on the display 503. The memory control function 517 interfaces with the system memory 502. The system memory 502 may be a multi-level system memory.

The computing system may contain a stacked die package as described above. For example, the upper die may be a system memory chip and the lower die may be a system-on-chip that includes the processing cores (and, e.g., the memory controller and/or the I/O control unit).

Each of the touchscreen display 503, the communication interfaces 504-507, the GPS interface 508, the sensors 509, the camera 510, and the speaker/microphone codec 513, 514 all can be viewed as various forms of I/O (input and/or output) relative to the overall computing system including, where appropriate, an integrated peripheral device as well (e.g., the camera 510). Depending on implementation, various ones of these I/O components may be integrated on the applications processor/multi-core processor 550 or may be located off the die or outside the package of the applications processor/multi-core processor 550.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

An apparatus has described that includes a first semiconductor die. A second semiconductor die is stacked on the first semiconductor die. The first semiconductor die has a larger surface area than the second semiconductor die such that there exists a peripheral region of the first semiconductor die that is not covered by the second semiconductor die. The apparatus includes thermally conductive material above the second semiconductor die. The apparatus includes a compound mold between the thermally conductive material and both the second semiconductor die and the peripheral region of the first semiconductor die. The apparatus includes a thermally conductive structure extending through the compound mold that thermally couples the peripheral region to the thermally conductive material.

In an embodiment, the compound mold comprises a thermally insulating filler. In yet another embodiment, the compound mold does not comprise a substantially thermally conductive filler. In yet another embodiment, the compound mold comprises a thermal conductivity of less than 2.0 W/mk. In yet another embodiment, the thermally conductive structure is formed from thermally conductive paste. In yet another embodiment, the thermally conductive structure is located over a hot spot of the first semiconductor die. In yet another embodiment, the apparatus includes a second thermally conductive structure over the hot spot, the thermally conductive structure extending through the compound mold that thermally couples the hot spot to the peripheral region. In yet another embodiment, the apparatus includes a second thermally conductive structure extending through the compound mold that thermally couples the peripheral region to the thermally conductive material.

A method has been described that includes stacking a second semiconductor die onto a first semiconductor die to form a stacked semiconductor die structure. The first semiconductor die has a larger surface area than the second semiconductor die such that there exists a peripheral region of the first semiconductor die that is not covered by the second semiconductor die. The method further includes forming a compound mold over the stacked semiconductor die structure. The further includes creating an opening in the compound mold over the peripheral region. The method further includes inserting first thermally conductive material into the opening. The method further includes forming second thermally conductive material over the compound mold, the first thermally conductive material thermally coupling the second thermally conductive material and the peripheral region.

In an embodiment, the compound mold comprises a silica filler. In another embodiment, the compound mold does not comprise an alumina or copper filler. In another embodiment the compound mold comprises a thermal conductivity of less than 2.0 W/mk. In another embodiment the first thermally conductive material comprises solder paste. In another embodiment the first thermally conductive material is located over a hot spot of the first semiconductor die.

A computer has also been described that includes a plurality of processing cores coupled to a memory controller. The memory controller is coupled to a system memory and a peripheral control hub. The computer further includes a first semiconductor die and a second semiconductor die. The second semiconductor die is stacked on the first semiconductor die. The first semiconductor die has a larger surface area than the second semiconductor die such that there exists a peripheral region of the first semiconductor die that is not covered by the second semiconductor die. A thermally conductive material resides above the second semiconductor die. A compound mold exists between the thermally conductive material and both the second semiconductor die and the peripheral region of the first semiconductor die. A thermally conductive structure extends through the compound mold that thermally couples the peripheral region to the thermally conductive material.

In an embodiment the compound mold comprises a thermally insulating filler. In yet another embodiment the compound mold does not comprise a substantially thermally conductive filler. In yet another embodiment the compound mold comprises a thermal conductivity of less than 2.0 W/mk. In an embodiment the thermally conductive structure is formed from solder paste. In an embodiment the second semiconductor chip is a system memory chip and the first semiconductor chip is a semiconductor chip that comprises the plurality of processing cores.

The invention claimed is:

1. An apparatus, comprising:
    a first semiconductor die;
    a second semiconductor die stacked on the first semiconductor die, the first semiconductor die having a larger surface area than the second semiconductor die such that there exists a peripheral region of the first semiconductor die that is not covered by the second semiconductor die;
    thermally conductive material above the second semiconductor die;
    a compound mold laterally adjacent to but not over the second semiconductor die and between the thermally conductive material and the peripheral region of the first semiconductor die, the compound mold further laterally adjacent to the first semiconductor die, wherein the compound mold does not comprise a thermally conductive filler; and,
    a thermally conductive structure extending through the compound mold that thermally couples the peripheral region to the thermally conductive material.

2. The apparatus of claim 1 wherein the compound mold comprises a thermally insulating filler.

3. The apparatus of claim 1 wherein the compound mold comprises a thermal conductivity of less than 2.0 W/mK.

4. The apparatus of claim 1 wherein the thermally conductive structure is formed from thermally conductive paste.

5. The apparatus of claim 1 wherein the thermally conductive structure is located over a hot spot of the first semiconductor die.

6. The apparatus of claim 5 further comprising a second thermally conductive structure over a second hot spot, the second thermally conductive structure extending through the compound mold that thermally couples the second hot spot to the peripheral region.

7. The apparatus of claim 1 further comprising a second thermally conductive structure extending through the compound mold that thermally couples the peripheral region to the thermally conductive material.

8. A computer, comprising:
    a plurality of processing cores coupled to a memory controller, the memory controller coupled to a system memory and a peripheral control hub, the computer further comprising: a first semiconductor die;
    a second semiconductor die stacked on the first semiconductor die, the first semiconductor die having a larger surface area than the second semiconductor die such that there exists a peripheral region of the first semiconductor die that is not covered by the second semiconductor die;
    thermally conductive material above the second semiconductor die;
    a compound mold laterally adjacent to but not over the second semiconductor die and between the thermally conductive material and the peripheral region of the first semiconductor die, the compound mold further laterally adjacent to the first semiconductor die, wherein the compound mold does not comprise a thermally conductive filler; and,
    a thermally conductive structure extending through the compound mold that thermally couples the peripheral region to the thermally conductive material.

9. The computer of claim 8 wherein the compound mold comprises a thermally insulating filler.

10. The computer of claim 8 wherein the compound mold comprises a thermal conductivity of less than 2.0 W/mK.

11. The computer of claim 8 wherein the thermally conductive structure is formed from solder paste.

12. The computer of claim 8 wherein the second semiconductor chip is a system memory chip and the first semiconductor chip is a semiconductor chip that comprises the plurality of processing cores.

13. An apparatus, comprising:
    a first semiconductor die;
    a second semiconductor die stacked on the first semiconductor die, the first semiconductor die having a larger surface area than the second semiconductor die such that there exists a peripheral region of the first semiconductor die that is not covered by the second semiconductor die;
    thermally conductive material above the second semiconductor die;
    a compound mold between the thermally conductive material and both the second semiconductor die and the peripheral region of the first semiconductor die; and,
    a thermally conductive structure extending through the compound mold that thermally couples the peripheral region to the thermally conductive material, wherein the thermally conductive structure is formed from thermally conductive paste.

14. The apparatus of claim 13, wherein the compound mold is laterally adjacent to but not over the second semiconductor die, and the compound mold between the thermally conductive material and the peripheral region of the first semiconductor die, and wherein the compound mold is further laterally adjacent to the first semiconductor die.

15. A computer, comprising:
    a plurality of processing cores coupled to a memory controller, the memory controller coupled to a system memory and a peripheral control hub, the computer further comprising: a first semiconductor die;
    a second semiconductor die stacked on the first semiconductor die, the first semiconductor die having a larger surface area than the second semiconductor die such that there exists a peripheral region of the first semiconductor die that is not covered by the second semiconductor die;
    thermally conductive material above the second semiconductor die, wherein the thermally conductive structure is formed from solder paste;
    a compound mold laterally adjacent to but not over the second semiconductor die and between the thermally conductive material and the peripheral region of the first semiconductor die, the compound mold further laterally adjacent to the first semiconductor die; and,
a thermally conductive structure extending through the compound mold that thermally couples the peripheral region to the thermally conductive material.

* * * * *